(12) United States Patent  
Liu et al.

(10) Patent No.: US 9,064,888 B2  
(45) Date of Patent: Jun. 23, 2015

(54) FORMING TUNNELING FIELD-EFFECT TRANSISTOR WITH STACKING FAULT AND RESULTING DEVICE

(71) Applicant: GLOBALFOUNDRIES, Inc., Grand Cayman, KY (US)

(72) Inventors: Yanxiang Liu, Wappingers Falls, NY (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/931,211

(22) Filed: Jun. 28, 2013

(65) Prior Publication Data

US 2015/0001594 A1    Jan. 1, 2015

(51) Int. Cl.
| | |
|---|---|
| H01L 21/336 | (2006.01) |
| H01L 27/088 | (2006.01) |
| H01L 29/78 | (2006.01) |
| H01L 29/66 | (2006.01) |

(52) U.S. Cl.
CPC .......... *H01L 29/66477* (2013.01); *H01L 29/78* (2013.01)

(58) Field of Classification Search
CPC ............ H01L 27/092; H01L 29/66477; H01L 29/66431; H01L 29/0895; H01L 29/785
See application file for complete search history.

(56) References Cited

U.S. PATENT DOCUMENTS

| | | | |
|---|---|---|---|
| 2012/0108023 A1* | 5/2012 | Lim et al. | 438/286 |
| 2012/0193679 A1 | 8/2012 | Chen et al. | |
| 2013/0328133 A1* | 12/2013 | Song et al. | 257/392 |
| 2014/0048765 A1* | 2/2014 | Ma et al. | 257/12 |

OTHER PUBLICATIONS

Thompson, S. et al., "Key Differences for Process-induced Uniaxial vs. Substrate-induced Biaxial Stressed Si and Ge Channel MOSFETS", Electrons Devices Meeting, 2004. IEDM Technical Digest, 4 pages.
Hu, C.,"Green Transistor as a Solution to the IC Power Crisis", IEEE, 2008, 4 pages.
Flachowsky, S. et al., "Stress Memorization Technique for n-MOSFETs: Where is the Stress Memorized?", ULIS 2010—Ultimate Integration on Silicon, dated Mar. 18-19, 2010, pp. 149-152.
Lim, J. et al., "Comparison of Threshold-Voltage Shifts for Uniaxial and Biaxial Tensile-Stressed n-MOSFETs", IEEE Electron Device Letters, vol. 25. No. 11, dated Nov. 2004, pp. 731-733.
Wang, C. et al., "Modeling of Layout-Dependent Stress Effect in CMOS Design", 2009 IEEE/ACM International Conference on Computer-Aided Design Digest of Technical Papers, pp. 513-520.

* cited by examiner

*Primary Examiner* — Brett Feeney
*Assistant Examiner* — Pamela E Perkins
(74) *Attorney, Agent, or Firm* — Ditthavong & Steiner, P.C.

(57) ABSTRACT

Methods for forming stacking faults in sources, or sources and drains, of TFETs to improve tunneling efficiency and the resulting devices are disclosed. Embodiments may include designating areas within a substrate that will subsequently correspond to a source region and a drain region, selectively forming a stacking fault within the substrate corresponding to the source region, and forming a tunneling field-effect transistor incorporating the source region and the drain region.

10 Claims, 10 Drawing Sheets

US 9,064,888 B2

FORMING TUNNELING FIELD-EFFECT TRANSISTOR WITH STACKING FAULT AND RESULTING DEVICE

TECHNICAL FIELD

The present disclosure relates to tunneling field-effect transistors (TFETs). The present disclosure is particularly applicable to forming TFETs for the 20 nanometer (nm) technology node and beyond.

BACKGROUND

To avoid the 60 millivolt (mV) per decade sub-threshold slope limit, carriers within a field-effect transistor (FET) must not go over the P/N junction barrier. Band-to-band (BTB) tunneling that occurs in TFETs is not subjected to this limit because the carriers do not flow over a potential barrier. Rather, the carriers tunnel through the barrier. However, TFETs suffer from low drive current as a result of poor tunneling efficiency.

A need therefore exists for a method of providing improved tunneling efficiency in TFETs, and the resulting device.

SUMMARY

An aspect of the present disclosure is a method of forming stacking faults in sources, or sources and drains, of TFETs to improve tunneling efficiency.

Another aspect of the present disclosure is TFETs with increased tunneling efficiency based on stacking faults in sources, or sources and drains.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including designating areas within a substrate that will subsequently correspond to a source region and a drain region, selectively forming a stacking fault within the substrate corresponding to the source region, and forming a tunneling field-effect transistor incorporating the source region and the drain region.

An aspect of the present disclosure includes forming another stacking fault within the substrate corresponding to the drain region. Another aspect of the disclosure includes creating tensile stress within the substrate to form the stacking fault. Yet an additional aspect of the disclosure includes selectively forming an amorphization implant mask above the substrate exposing the source region to form the stacking fault. A further aspect includes, where the substrate is formed of silicon, forming a transition between an amorphous state and a crystalline state of the silicon to form the stacking fault. Additional aspects include doping the source region and the drain region to form a source and a drain, respectively, of the TFET, and forming an inversely doped pocket in the source. Another aspect includes forming the inversely doped pocket above the stacking fault and underneath a gate of the TFET. Yet another aspect includes forming the stacking fault across substantially an entire thickness of the source region.

Another aspect of the present disclosure is a device including: TFET including: a substrate, a source and a drain within the substrate, a gate between the source and the drain, and a stacking fault within the source.

An aspect includes the TFET including a stacking fault within the drain. Another aspect includes the stacking fault within the source being tensile stress within the substrate. Another aspect includes the stacking fault being is formed using an amorphization implant mask to selectively expose the source. Additional aspects include the substrate being formed of silicon, and the stacking fault formed as a transition between an amorphous state and a crystalline state of the silicon. Yet another aspect includes an inversely doped pocket in the source. Still another aspect includes the inversely doped pocket being formed above the stacking fault and underneath the gate. An additional aspect includes the stacking fault extending across substantially an entire thickness of the source.

According to the present disclosure, additional technical effects may be achieved in part by a method including: forming a stacking fault in a region of a silicon substrate, doping the region of the silicon substrate, forming a source, doping another region of the silicon substrate, forming a drain, and forming a TFET incorporating the source and the drain.

Further aspects of the present disclosure include selectively forming the stacking fault in the region by forming an amorphization implant mask above the region of the silicon substrate. Yet another aspect of the present disclosure includes forming a transition between an amorphous state and a crystalline state of the silicon substrate to form the stacking fault. Still another aspect of the present disclosure includes forming an inversely doped pocket in the source above the stacking fault and underneath the gate of the tunneling field-effect transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of low drive current attendant upon TFETs. In accordance with embodiments of the present disclosure, stacking faults are formed in the source, or the source and drain, regions of the TFETs to effectively narrow the silicon (Si) band gap to enhance BTB tunneling efficiency.

Methodology in accordance with an embodiment of the present disclosure includes designating an area within a substrate that will subsequently correspond to a source region, or areas within a substrate that will subsequently correspond to a source region and a drain region. Stacking faults are then selectively formed in the source region, or the source and drain regions, causing tensile stress within the substrate. The stacking fault may be a transition between an amorphous state and a crystalline state of the substrate, such as Si, that narrows the Si band gap and reduces the drive current.

Figure 1:
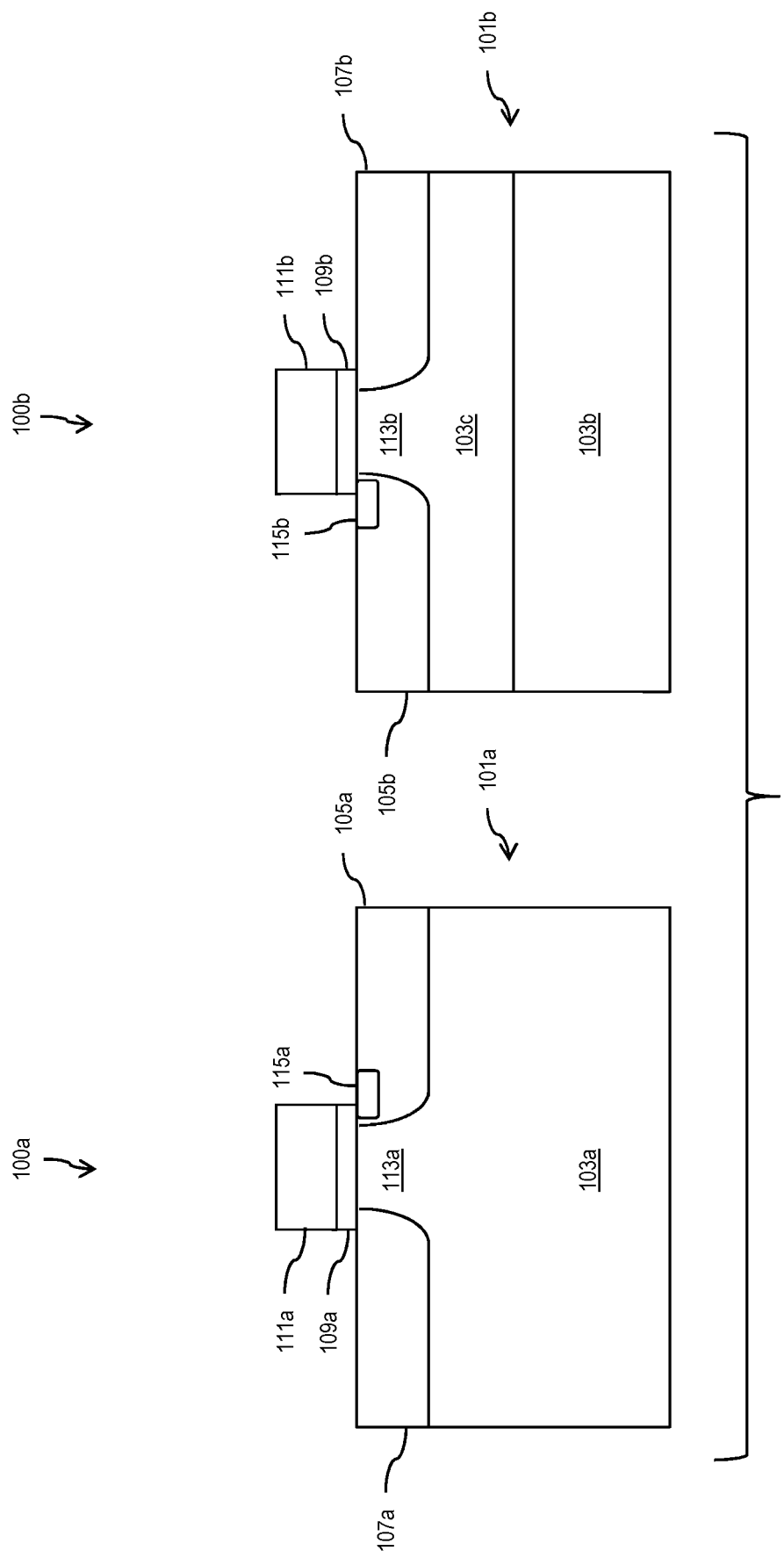
FIGS. 1 through 2B illustrate a method for forming TFETs with stacking faults in the source, or source and drain, regions, in accordance with an exemplary embodiment.

Adverting to FIG. 1, a method for forming stacking faults in sources, or sources and drains, of TFETs to improve tunneling efficiency, according to an exemplary embodiment, begins with an n-type TFET (NTFET) 100a and a p-type TFET (PTFET) 100b. Although illustrated as being discontinuous, the NTFET 100a and the PTFET 100b may be formed within a single, continuous substrate. The NTFET 100a is formed of a semiconductor substrate 101a, which may include any semiconductor material such as Si, germanium (Ge), silicon germanium (SiGe), silicon carbide (SiC), silicon-on-insulator (SOI), or SiGe-on-insulator (SGOI). The substrate 101a may include a lightly n-doped region 103a, a source region 105a, and a drain region 107a. The source region 105a may be p-doped and the drain region 107a may be n-doped. However, the source region 105a and the drain region 107a may merely be regions designated within the substrate 101a that are later doped to form sources and drains, such that the regions are not necessarily already doped.

Further, the NTFET 100a includes a gate stack formed of an oxide layer 109a and a gate layer 111a above the substrate 101a. The gate oxide layer 109a may be formed of any gate oxide material, such as silicon dioxide ($SiO_2$), and the gate layer 111a may be formed of any type of gate material. Although not shown (for illustrative convenience), the gate stack may instead be formed of a dummy gate, such as of polysilicon (poly-Si), for subsequent removal and formation of a replacement metal gate. Below the gate stack and between the source region 105a and the drain region 107a is a channel 113a.

The PTFET 100b is formed of a semiconductor substrate 101b, which may include any semiconductor material such as Si, Ge, SiGe, SiC, SOI, or SGOI. The substrate 101b may include a lightly n-doped region 103b, a p-well region 103c, a source region 105b and a drain region 107b. The source region 105b may be n-doped and the drain region 107b may be p-doped. However, the source region 105b and the drain region 107b may merely be regions within the substrate 101a that are later doped such that, as illustrated in FIG. 1, the regions are not necessarily pre-doped.

Further, the PTFET 100b includes a gate stack formed of an oxide layer 109b and a gate layer 111b above the substrate 101b. The gate oxide layer 109b may be formed of any gate oxide material, such as $SiO_2$, and the gate layer 111b may be formed of any type of gate material. Although not shown (for illustrative convenience), the gate stack may instead be formed of a dummy gate, such as of poly-Si, for subsequent removal and formation of a replacement metal gate. Below the gate stack and between the source region 105b and the drain region 107b is a channel 113b.

Although not required, the source regions 105a and 105b may have pocket regions 115a and 115b, respectively, to further improve a surface tunneling junction between the source regions 105a and 105b and the channels 113a and 113b, respectively. The pocket regions 115a and 115b may be above subsequently formed stacking faults 201 and below the gate stacks. Within the source region 105a the pocket region 115a is n-doped, and within the source region 105b the pocket region 115b is p-doped. The pocket regions 115a and 115b improve the junction between the source regions 105a and 105b and the channels 113a and 113b, respectively, for the NTFET 100a and PTFET 100b.

Figure 2A:
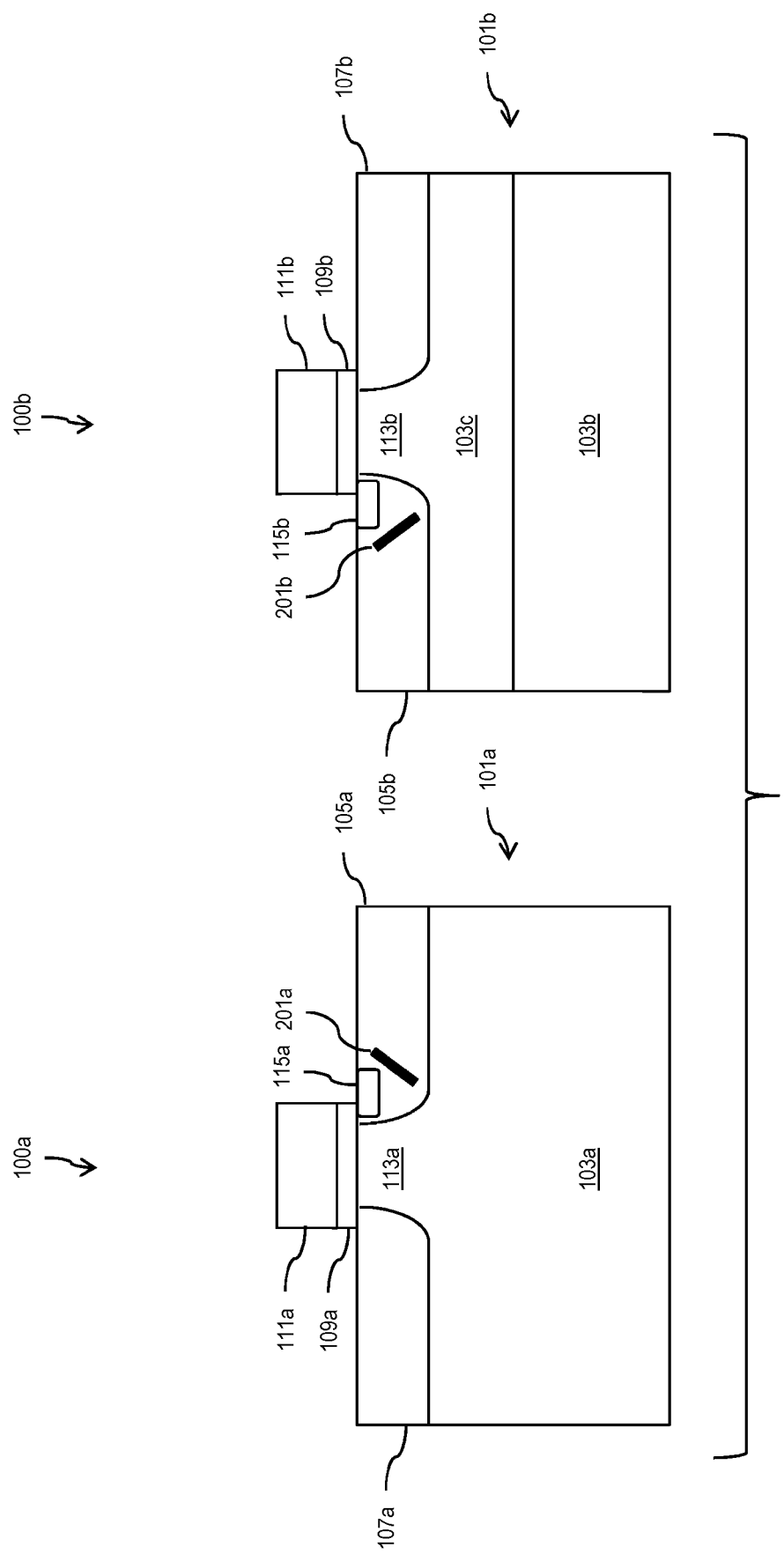
Figure 2B:
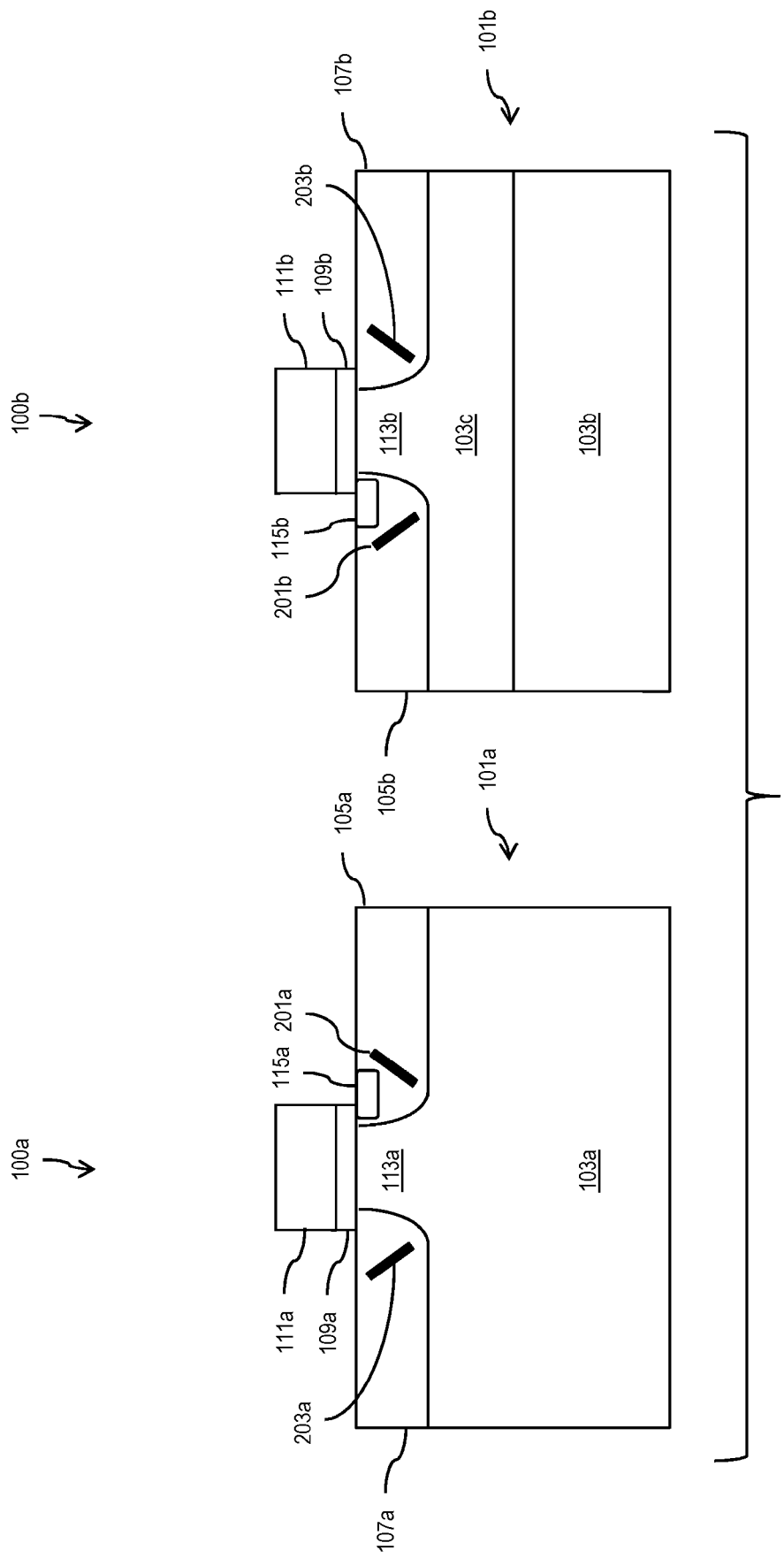

Adverting to FIG. 2A, the NTFET 100a and the PTFET 100b are subsequently processed to form stacking faults 201a and 201b in the source regions 105a and 105b, respectively. Alternatively, as illustrated in FIG. 2B, the NTFET 100a and the PTFET 100b are subsequently processed to also form stacking faults 203a and 203b in the drain regions 107a and 107b, respectively, in addition to the source regions 105a and 105b. The stacking faults 201a and 201b (as well as stacking faults 203a and 203b, if present) can be transitions between an amorphous state and a crystalline state of a silicon substrate. The stacking faults 201a and 201b improve tunneling efficiency by effectively narrowing down the Si band gap as a result of the tensile stress within the Si caused by the stacking faults 201a and 201b near the junction between the source regions 105a and 105b and the channels 113a and 113b, respectively. The narrowing of the Si band gap induces high BTB tunneling or gate-induced drain leakage (GIDL), causing higher orders of junction leakage. Specifically, at the p-doped source region 105a in the NTFET 100a, the stacking fault 201a narrows down the Si band gap at the P+/N tunneling junction between the source region 105a and the channel 113a. At the n-doped source region 105b in the PTFET 100b, the stacking fault 201b narrows down the Si band gap at the N+/P tunneling junction between the source region 105b and the channel 113b.

Figure 3A:
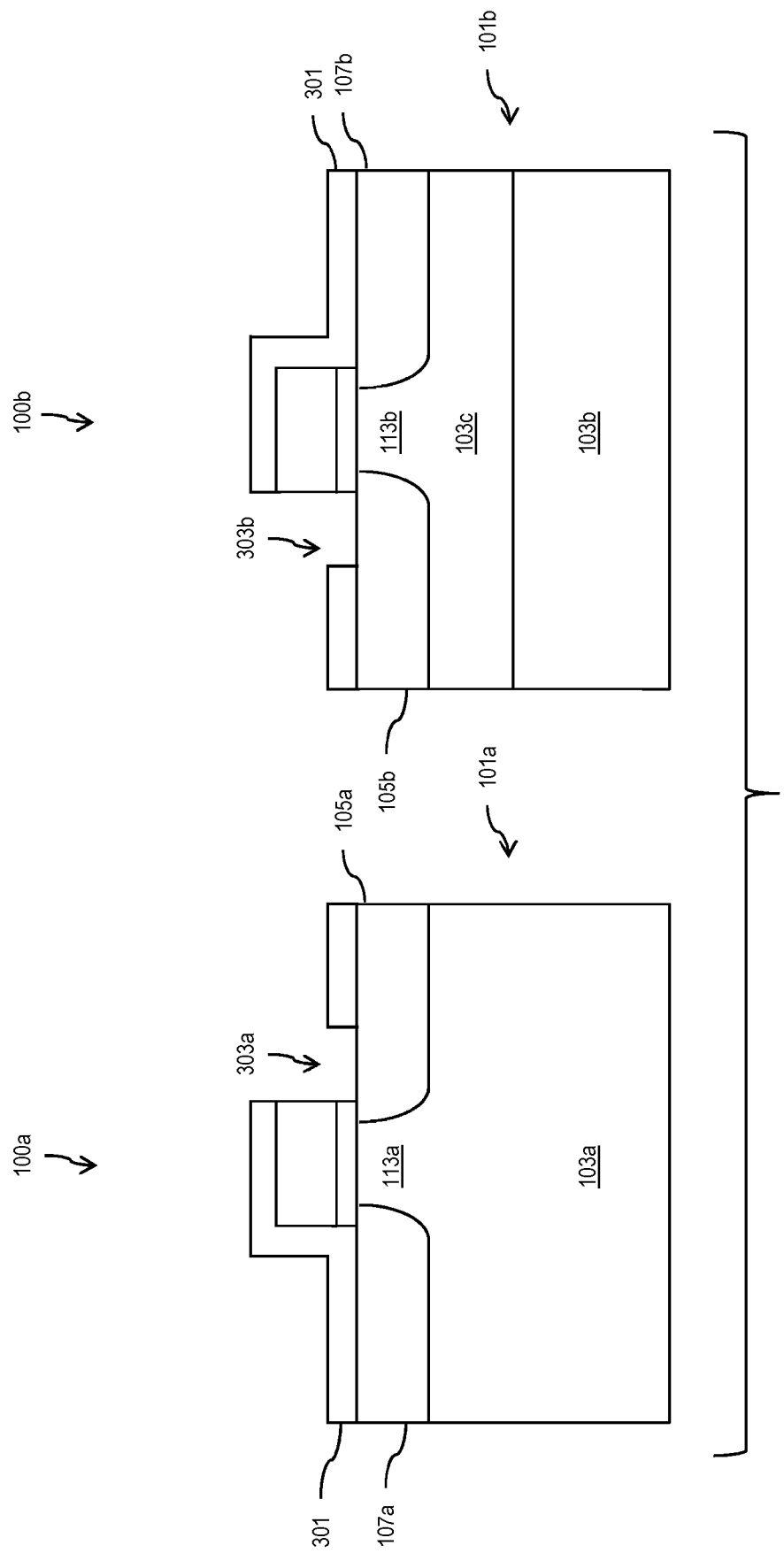
FIGS. 3A through 3G illustrate a specific method for forming stacking faults in the source, or source and drain, regions in TFETs, in accordance with an exemplary embodiment.

The stacking faults may be formed in the source regions 105a and 105b and the drain regions 107a and 107b according to any stress memorization technique that forms stress, such as tensile stress, in the substrate 101a and 101b. FIGS. 3A through 3G illustrate a specific method for forming the stacking faults according to one stress memorization technique. As illustrated in FIG. 3A, a pre-amorphization implantation mask 301 is formed over the NTFET 100a and PTFET 100b illustrated in FIG. 1. The pre-amorphization implantation mask 301 may be conformally formed over the NTFET 100a and PTFET 100b. The pre-amorphization implantation mask 301 is used to selectively form openings 303a and 303b corresponding to the respective locations where the stacking faults 201a and 201b are formed in the NTFET 100a and the PTFET 100b. To form the stacking faults 203a and 203b, corresponding openings may be made in the pre-amorphization implantation mask 301 (not shown for illustrative convenience).

Figure 3B:
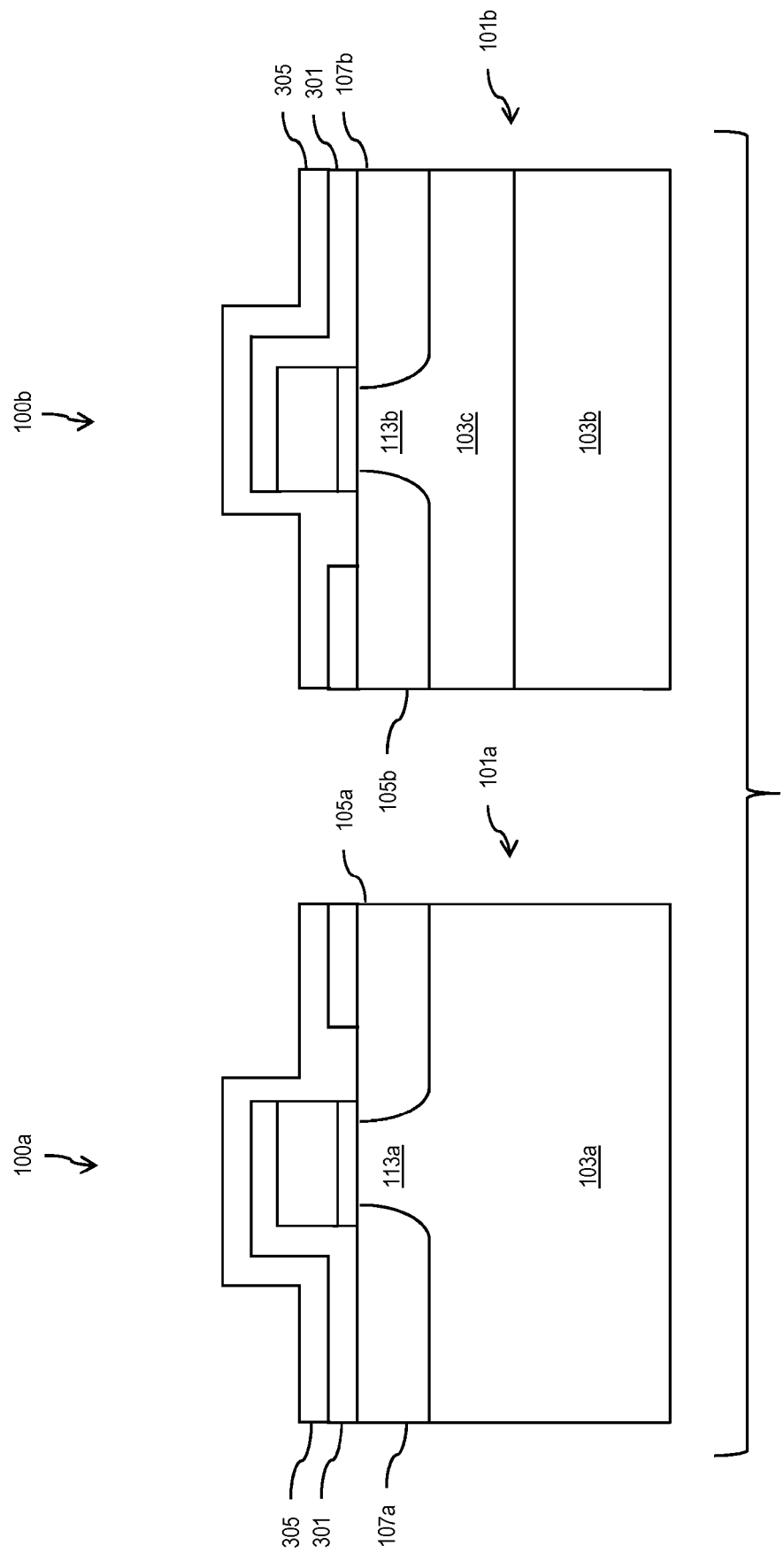

Next, an oxide layer 305 is formed over the pre-amorphization implantation mask 301, as illustrated in FIG. 3B. The oxide layer 305 may be formed of any oxide, such as $SiO_2$, to a thickness of for example 40 Å. The oxide layer 305 may be formed according to various techniques, such as conformally depositing the oxide layer 305 over the pre-amorphization implantation mask 301. The oxide layer 305 fills the openings 303 in the pre-amorphization implantation mask 301 and comes into contact with the substrates 101a and 101b.

Figure 3C:
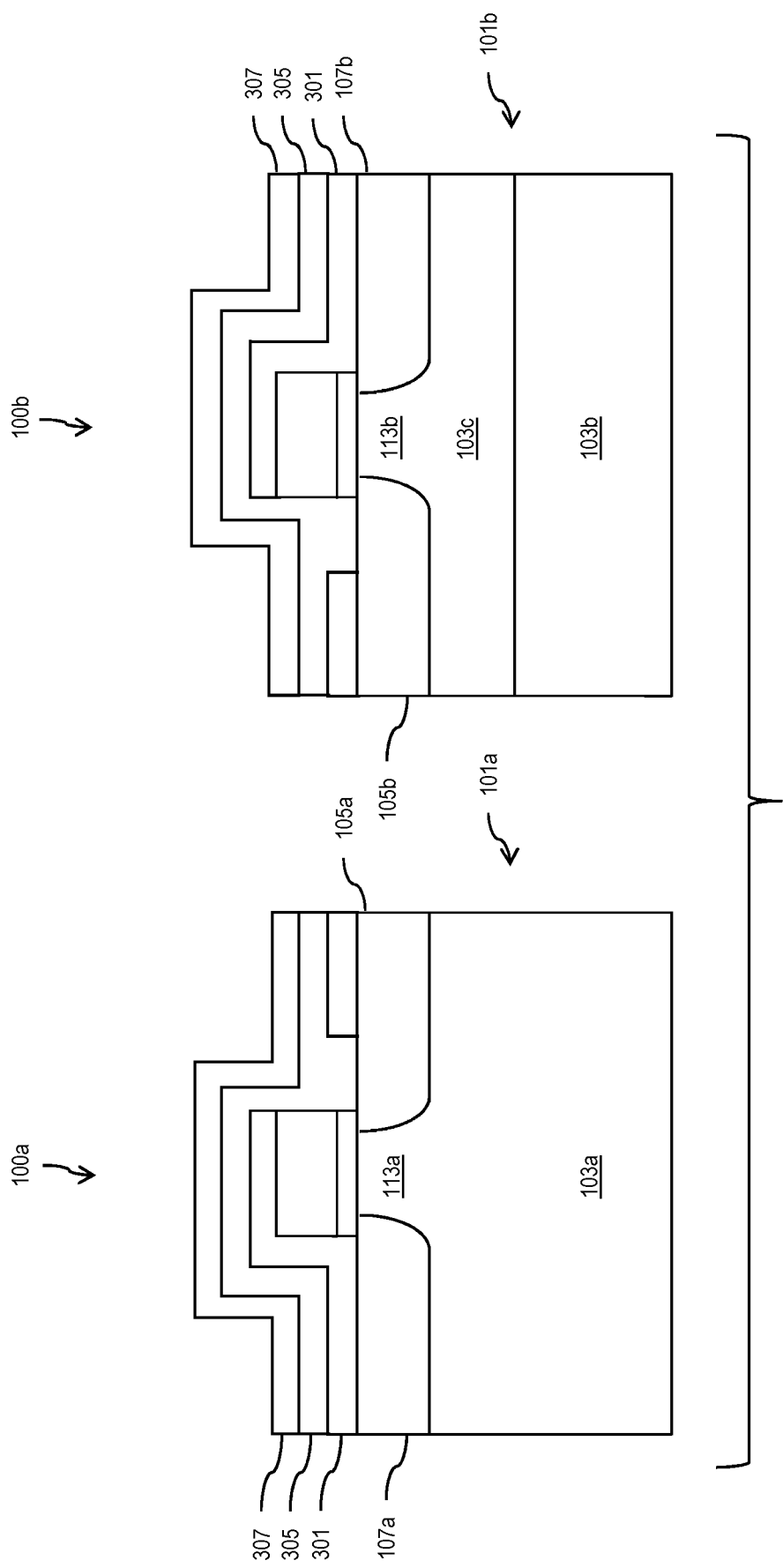

A silicon nitride (SiN) layer 307 is then formed over the oxide layer 305, as illustrated in FIG. 3C. The SiN layer 307 may be formed to a thickness of for example 400 Å, and may be conformally deposited over the oxide layer 305, such as by plasma enhanced chemical vapor deposition (PECVD).

Figure 3D:
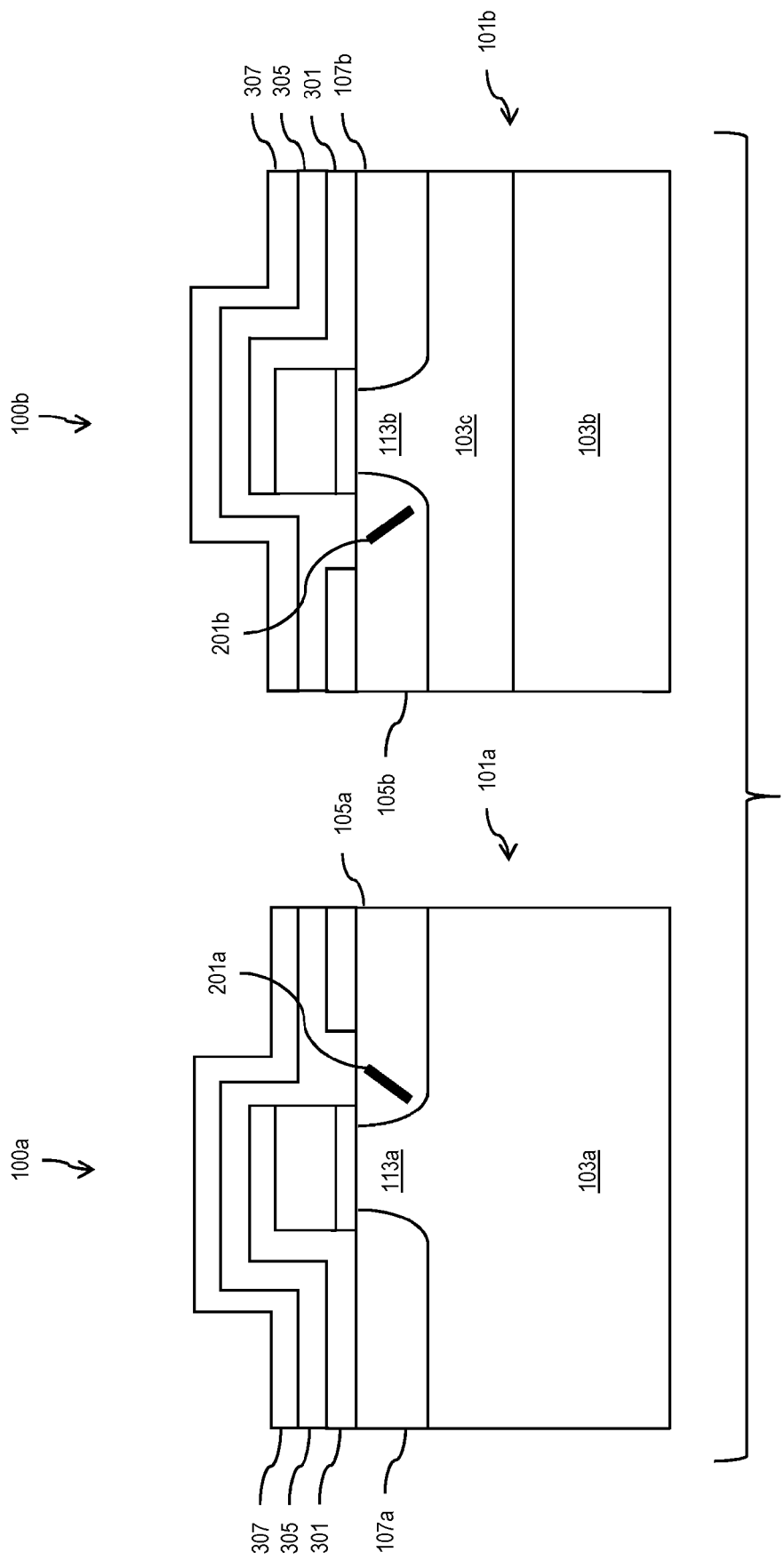

After forming the SiN layer 307, the resulting structures are heated at for example 650° C., for 10 minutes, for example, in an inert atmosphere, such as in the presence of nitrogen gas ($N_2$). The resulting structure and heat treatment causes stacking faults to form in the substrates 101*a* and 101*b* corresponding to the openings 303*a* and 303*b* in the pre-amorphization implantation mask 301 as a result of tensile and compressive stress within the substrates 101*a* and 101*b*, as illustrated in FIG. 3D.

Figure 3E:
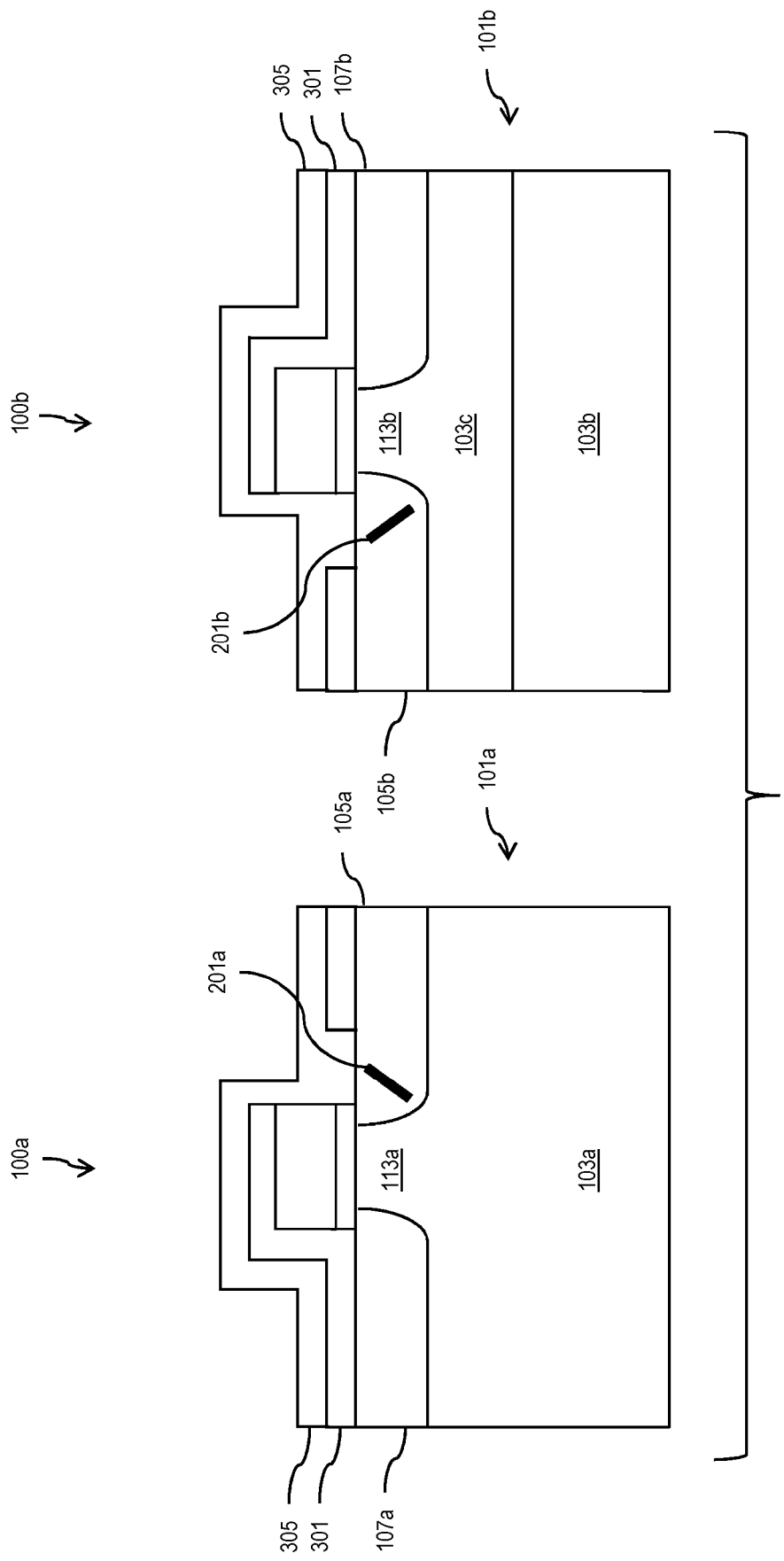
Figure 3F:
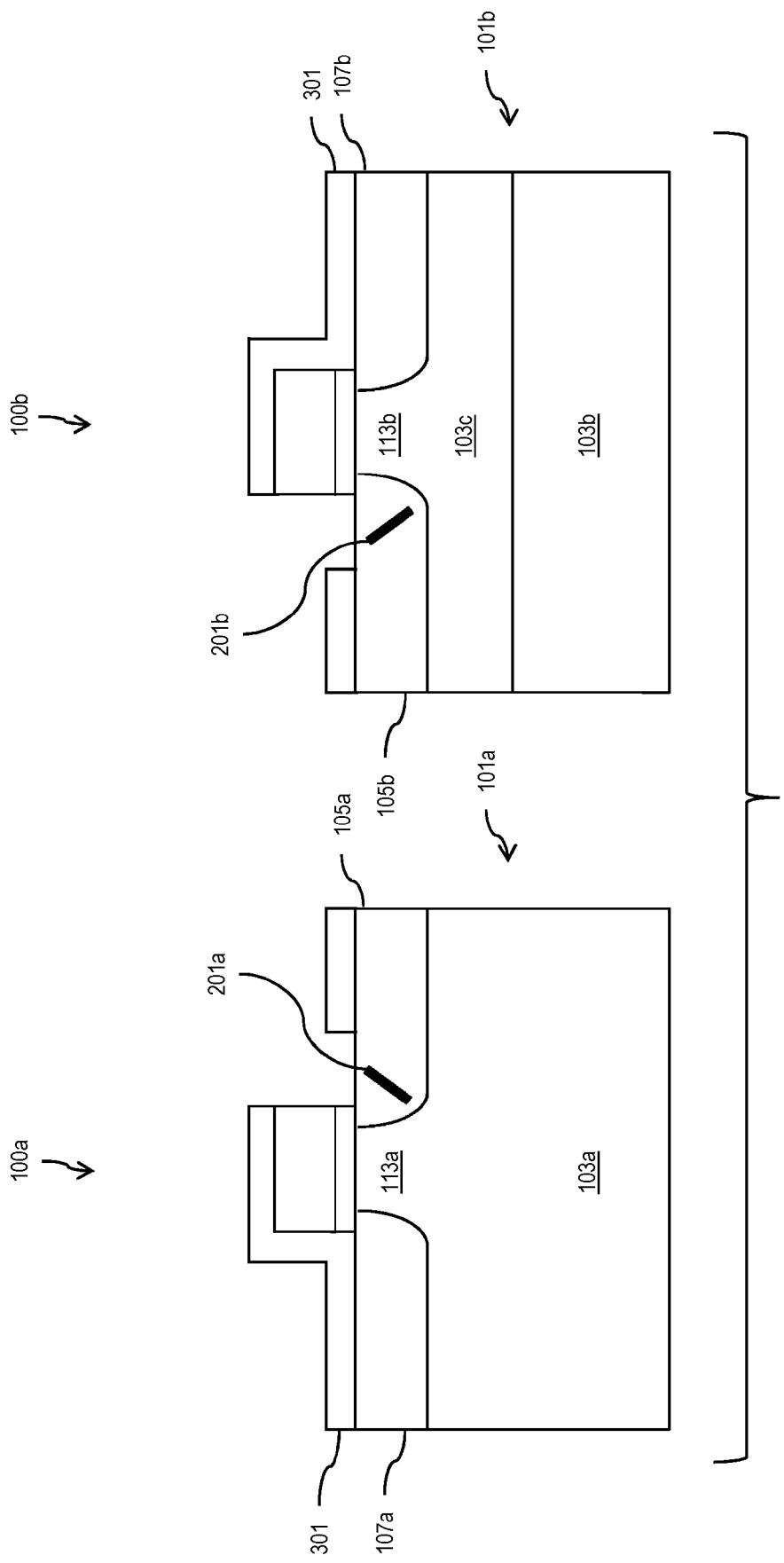
Figure 3G:
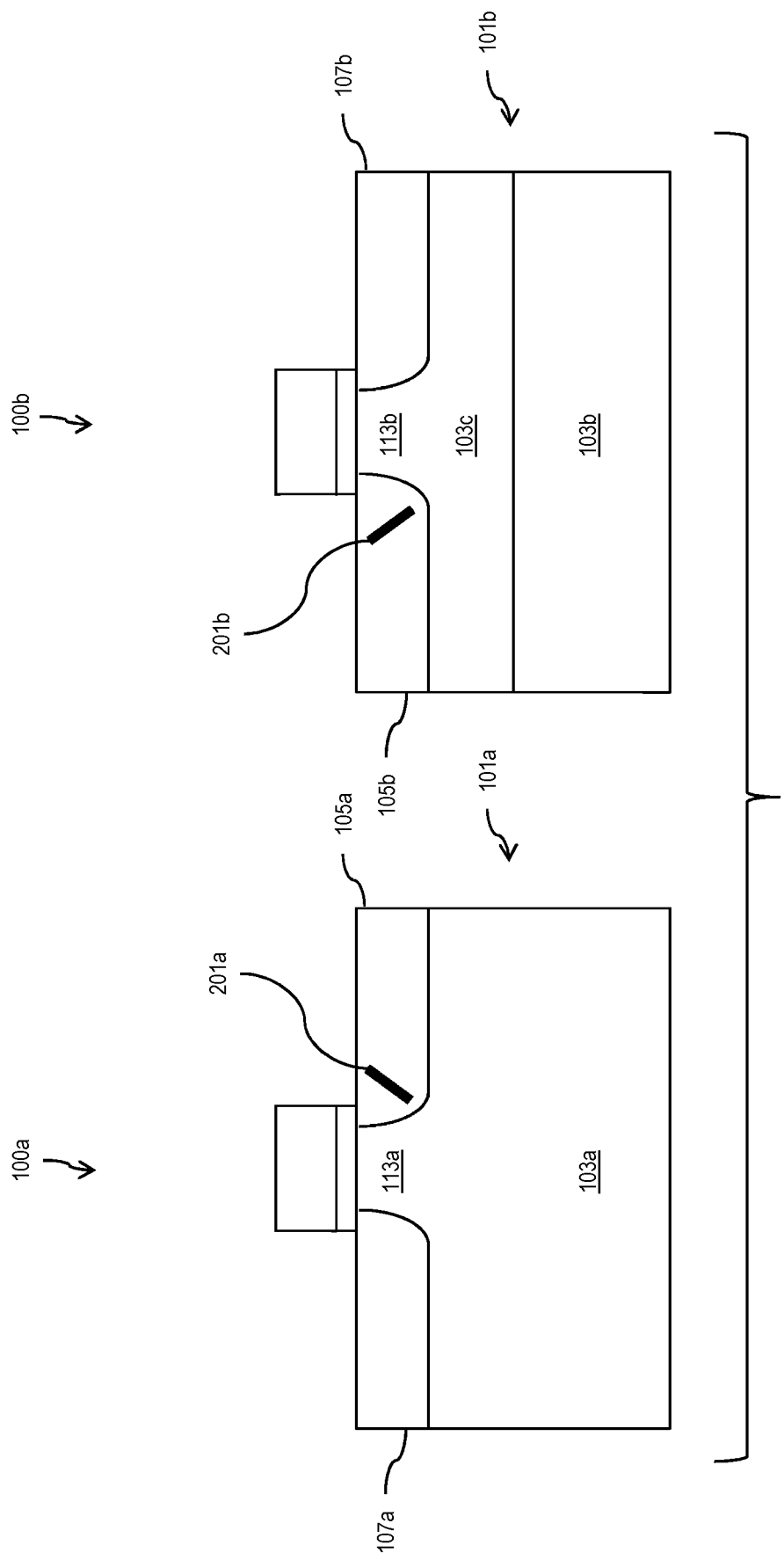

Subsequently, the SiN layer 307 is then removed, as illustrated in FIG. 3E. The SiN layer 307 may be removed by the application of a layer of hot phosphorous. The oxide layer 305 is then removed, as illustrated in FIG. 3F. The oxide layer 305 may be removed by the application of a layer of dilute hydrofluoric acid (dHF). Subsequently, the pre-amorphization implantation mask 301 is stripped according to any conventional technique, as illustrated in FIG. 3G. The result is a NTFET 100*a* and a PTFET 100*b* (as illustrated in FIG. 2A). Subsequent processing may then proceed in further forming the NTFET 100*a* and the PTFET 100*b*, such as forming raised sources and drains, implanting the source regions 105*a* and 105*b* and the drain regions 107*a* and 107*b* and forming replacement metal gates. Accordingly, the method described above with respect to FIGS. 3A through 3G can be implemented in forming any Si complementary metal-oxide-semiconductor (CMOS) in the formation of TFETs.

The embodiments of the present disclosure achieve several technical effects, including effectively narrowing down the Si band gap to enhance BTB tunneling efficiency while being fully compatible with current Si CMOS technology without adding extra process complexity. As discussed above, the embodiments of the present disclosure can be further optimized with other improvements to TFETs, such as junction design or hetero-structures to even further increase tunneling efficiency. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices, particularly in the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    designating areas within a substrate that will subsequently correspond to a source region and a drain region;
    selectively forming a stacking fault within the substrate corresponding to the source region;
    forming a tunneling field-effect transistor incorporating the source region and the drain region;
    doping the source region and the drain region to form a source and a drain, respectively, of the tunneling field-effect transistor; and
    forming an inversely doped pocket in the source.

2. The method according to claim 1, further comprising:
    forming another stacking fault within the substrate corresponding to the drain region.

3. The method according to claim 1, comprising:
    creating tensile stress within the substrate to form the stacking fault.

4. The method according to claim 1, further comprising:
    selectively forming an amorphization implant mask above the substrate exposing the source region to form the stacking fault.

5. The method according to claim 1, wherein the substrate is formed of silicon, the method comprising:
    forming a transition between an amorphous state and a crystalline state of the silicon to form the stacking fault.

6. The method according to claim 1, comprising:
    forming the inversely doped pocket above the stacking fault and underneath a gate of the tunneling field-effect transistor.

7. The method according to claim 1, comprising:
    forming the stacking fault across substantially an entire thickness of the source region.

8. A method comprising:
    forming a stacking fault in a region of a silicon substrate;
    doping the region of the silicon substrate, forming a source;
    doping another region of the silicon substrate, forming a drain;
    forming a tunneling field-effect transistor incorporating the source and the drain; and
    forming an inversely doped pocket in the source above the stacking fault and underneath the gate of the tunneling field-effect transistor.

9. The method according to claim 8, further comprising:
    selectively forming the stacking fault in the region by forming an amorphization implant mask above the region of the silicon substrate.

10. The method according to claim 8, comprising:
    forming a transition between an amorphous state and a crystalline state of the silicon substrate to form the stacking fault.

* * * * *